United States Patent [19]
Schmidt et al.

[11] Patent Number: 5,323,135
[45] Date of Patent: Jun. 21, 1994

[54] METHOD FOR THE CONSTRUCTION OF AN OPTIMIZED MAGNET COIL

[75] Inventors: Hartmut Schmidt, Karlsruhe; Michael Westphal, Offenbach, both of Fed. Rep. of Germany

[73] Assignee: Bruker Analytische Messtechnik GmbH, Fed. Rep. of Germany

[21] Appl. No.: 35,739

[22] Filed: Mar. 22, 1993

[30] Foreign Application Priority Data

Mar. 28, 1992 [DE] Fed. Rep. of Germany ............. 4210217.0-33

[51] Int. Cl.$^5$ .............. G01R 33/38; H01F 7/20; H01F 41/04
[52] U.S. Cl. .................. 335/299; 324/318; 324/319
[58] Field of Search .............. 335/216, 299, 301; 324/318, 319, 320

[56] References Cited

U.S. PATENT DOCUMENTS

| | | | |
|---|---|---|---|
| 4,617,516 | 10/1986 | Schenck | 324/318 |
| 4,652,826 | 3/1987 | Yamamoto et al. | 324/320 |
| 4,724,412 | 2/1988 | Kalafala | 335/299 |
| 4,896,129 | 1/1990 | Turner et al. | 335/299 |
| 5,266,913 | 11/1993 | Chapman | 335/216 |

FOREIGN PATENT DOCUMENTS

0140259 5/1985 European Pat. Off. .
0320285 6/1989 European Pat. Off. .

Primary Examiner—Lincoln Donovan
Assistant Examiner—Raymond Barrera
Attorney, Agent, or Firm—Walter A. Hackler

[57] ABSTRACT

In a method for the production of a magnet coil arrangement which can create a predetermined magnet field B and has a minimal inductance L. The magnetic field B to be generated is expanded in spherical harmonics with coefficients $C_{n,m}$ and a field error $\Delta B = f_1(C_{n,m})$ is defined fixing the deviation of the magnet field profile of the coil arrangement to be calculated from the given magnet field B within a volume and, if necessary, further parameters $P = f_2(C_{n,m})$ are predefined, whereby the value of P which is calculated with a particular set of coefficients $C_{n,m}$ is within predetermined limits. By defining limits for technically relevant parameters and their variation as well as by giving the desired minimum inductance, the procedure achieves a high flexibility in conjunction with independent optimization of the parameters, in particular field errors, minimum inductance and current density oscillations.

23 Claims, 13 Drawing Sheets

METHOD FOR THE CONSTRUCTION OF AN OPTIMIZED MAGNET COIL

FIELD OF THE INVENTION

The invention concerns a method for the production of a magnet coil configuration with one or more current carrying magnet coils, said coils having electrically conducting sections, whereby the electrically conducting sections are located on one or more coaxial cylinders or parallel planes and effect a quasi-continuous distribution of the current density j thereby creating a magnetic field B with a predetermined field distribution within a measuring volume inside the magnet coil configuration. The magnet coil configuration has a minimum inductance L in comparison to all possible coil configurations on the coaxial cylinders or planes which produce this field distribution. Such a method is for example known from European Patent Application EP-A1 0320 285.

BACKGROUND OF THE INVENTION

To an ever increasing extent, magnet coil configurations of the above mentioned kind are used in the field of nuclear spin resonance (NMR) technology for the production of magnetic fields or magnetic gradient fields. However, they may also be used in other technological fields. One of the main requirements is that, with the magnet coil configuration, a predetermined magnetic field distribution has to be produced as exactly as possible and the inductance L of the magnet coils must be as small as possible. Other boundary conditions must also be observed such as, for example, an optimum shielding of the exterior from the magnetic field produced inside the magnet coil configuration and minimized oscillation of the current density distribution produced by the current carrying magnet coils.

In the above mentioned publication, EP-A1 0320 285, an algorithm is described to calculate the geometrical data of such a magnet coil configuration which allows the calculation of the current density of the main and shielding coil in such a way that, with perfect shielding, the inductance L is minimum and the desired distribution of the magnetic field is given as defined only in an indistinct way by fixing singular field points. This algorithm is not limited to gradient systems, but may in principle be applied to all coil systems. Aside from the field points fixed at the outset, the resulting field produced by the magnet coil system and the corresponding field errors can be calculated at all points only after calculation of the current densities.

Since merely singular field points are predetermined by this procedure, the corresponding global field error is by no means defined a priori. The magnetic field may oscillate between the singular field points. A definition of the desired magnetic field including defined permissible field errors at the beginning would only be possible by predetermining the global field or by an intelligent, specific system of selecting geometrically well defined field points, whose relative geometry had to be fitted to the individual case. However, such a selection system is not described in the above mentioned publication EP-A1 0320 285. According to the specification, the disclosed method may only be described as a "trial and error", method with respect to the desired magnetic field distribution and defined maximum permissible errors.

As a consequence of the described "one way" algorithm, the known method yields no direct possibility to influence the variation of the current density distribution. In order to counteract unacceptably strong oscillations of the current density distribution and multiple current inversion, i. e. multiple change of sign of the winding directions within the coil, the known method suggests using an "apodising function". However, this careful smoothing works only outside the algorithm for minimum inductance etc., quoted in the publication. As is the case with the above mentioned field error, a technically realizeable current density distribution can also only be found by "trial and error", with this method. However, the above mentioned publication does not explicitly describe such a method or a corresponding set of parameters for smoothed shielding coils with minimum inductance. On the other hand, each current density distribution which deviates from the oscillating theoretically derived result additionally has the retroactive consequence of an only insufficient realization of the field distribution of the predetermined intended field, shielding effect and minimum inductance.

From all this, it is clear that the known method lacks any possibility of a direct coupling of global permissible field errors to the remaining properties of the magnet coil configuration which has to be calculated. Therefore there is also no practical possibility to optimize each desired magnet coil system to the one configuration with minimum errors. Moreover, the strongly oscillating current density distribution as calculated according to the known method can either not at all be technically realized or only in a limited sense. As a consequence, however, the properties coupled mathematically to the respective current density distribution (with or without oscillations) as minimum inductance, maximum shielding, etc. can also only be realized in a limited sense.

It is therefore the object of the invention to present a method of the above mentioned kind which yields results that can technically be used as easily as possible whereby in addition to the required minimization of the inductance L within predetermined boundary conditions, also additional technically relevant parameters of the magnet coil configuration can be optimized independently from each other.

BRIEF SUMMARY OF THE INVENTION

This object is achieved by the invention in that the arrangement of the electrically conducting sections is chosen such that if a current is flowing through the magnet coils a particular current distribution results which is determined by the following steps:

a. Expansion of the field distribution of the z component $B_z$ of the magnetic field B in a series with the coefficient $C_{n,m}$;

b. Definition of a maximum permissible field error $\Delta B_z^{max}$ within the measuring volume or a partial volume as a function $f_1$ of the coefficients $C_{n,m}$;

c. Fixing of a permissible range of values $[L^{min}, L^{max}]$ for the inductance L and defining L as a function of the coefficients $C_{n,m}$;

d. Optional definition of one or more further technically relevant parameters of the magnet coil configuration as a function $f_2, f_3, \ldots$ etc. of the coefficients $C_{n,m}$;

e. Fixing of permissible ranges of values $[f_2^{min}, f_2^{max}]$, $[f_3^{min}, f_3^{max}], \ldots$ etc. for the further parameters $f_2, f_3, \ldots$;

f. Setting of predetermined fixed values for a part of the coefficients $C_{n,m}$;

g. Calculation of continuous current densities j, whereby j is defined as a function of the coefficients $C_{n,m}$, on the coaxial cylinders or planes, using these values;

h. Calculation of the inductance L using these values;

i. Calculation of a finite number of further coefficients $C_{m,n}$ with increasing indices n,m;

j. Calculation of the field distribution of the magnetic field $B_z$ inside the measuring volume or a partial volume and determination of the field error $\Delta B_z = f_1 (C_{n,m})$;

k. Possible calculation of the further parameters $f_2(C_{n,m})$, $f_3(C_{n,m})$, ... etc. using these values;

l. Comparison of the calculated field error $\Delta B_z$ with the permissible maximum value $\Delta B_z^{max}$, the calculated inductance L with the limits of the permissible range of values $[L^{min}, L^{max}]$ and the calculated further parameters $f_2$, $f_3$, ... etc. with the limits of the permissible ranges of values $[f_2^{min}, f_2^{max}]$, $f_3^{min}$, $f_3^{max}$], ... etc;

m. If all permissible limits are obeyed: either m1) accepting the result and using the continuous current densities j for a technically realizable quasi-continuous current distribution; or m2) repeating steps a. to l. with further restricted permissible limiting values and/or with an enlarged set of coefficients $C_{n,m}$ according to f.;

n. If at least one of the permissible limits is exceeded:

n1) Setting of new values for the predetermined coefficients $C_{n,m}$ either manually or by using a prior art optimizing algorithm which takes into account the deviations of the calculated values from the permissible limiting values;

n2) Repeating steps g. to m., possibly to n.

Use of the method of the invention makes it possible to calculate, and to make technical use of, the optimum geometrical data of a magnet coil arrangement which can produce a particular desired magnetic field distribution, whereby other important parameters such as e.g. inductance, current density oscillations, shielding effect, etc. are also optimized. The main advantage of the method according to the invention is the high flexibility obtained by the user through the possibility of an a priori definition of limits for technically relevant parameters, their variation during the course of the method and the setting of the desired inductance at the beginning. The method according to the invention results in a magnet coil configuration which can be easily technically realized, said method searching for and calculating, within a multi-dimensional space, the optima (maxima and minima, respectively) which are theoretically possible, e.g. the theoretically smallest possible linearity error if all other parameters are fixed.

The invention uses a subset of the expansion coefficients of the magnetic field to parametrize the variables to be optimized such as the magnetic field error $\Delta B_z$, the inductance L, and the current density j. These variables are therefore functions of the coefficients only and not of each other. This allows for a particularly effective individual optimization of the variables of interest in an uncoupled fashion, i.e. the parallel determination of their values. As will be further described below, a spherical harmonic expansion of the field permits the individual variables to be independent functions of the expansion coefficients for cases with cylindrical symmetry. This surprising result leads to the elegant independent parameterization of the variables in many cases of practical interest thereby dramatically simplifying the optimization problem as well as leading to superior results.

Starting from an accepted result of the method according to the invention, in one embodiment the permissible limits in step m2) are restricted and/or the set of relevant coefficients $C_{n,m}$ is enlarged until the results no longer change in a significant way if the limits are further restricted. In this way, the achieved result is again considerably improved with acceptable expenditure of effort.

In a preferred embodiment, the field error $\Delta B_z$, the inductance L or one of the further technical relevant parameters is purposefully optimized by successive restriction of the permissible limits for this parameter in step m2) until a solution is no longer produced. Preferably, in step f. between four and six coefficients $C_{n,m}$ are fixed, in particular the coefficients $C_{1,0}$ or $C_{1,1}$. The coefficient $C_{1,0}$ just corresponds, within the nomenclature of the series expansion of the field distribution of the magnetic field, to the strength of a magnetic gradient field in that direction. The coefficient $C_{1,1}$ represents a gradient strength in the X- or Y-direction, respectively.

In order to save calculation effort, in a preferred embodiment, less than 10 further coefficients $C_{n,m}$ are calculated in step i. As a rule, this is sufficient to obtain a field profile which approximates the real one as far as possible.

One embodiment of the method according to the invention is particularly preferred, whereby the field distribution of the magnetic field B is expanded in spherical harmonics in step a. The series expansion in spherical harmonics has proven to be particularly effective and mathematically simple for, surprisingly, coil configurations with cylindrical symmetry rather than an expansion in cylinder coordinates with, for example, Bessel functions.

In order to achieve a maximum shielding effect, the strength of the magnetic field B radially outside of the outermost cylinder or outside of the corresponding outermost parallel surface is, in the steps a or b, set to zero in a further preferred embodiment of the invention.

Shielded magnet coil systems are usually realized in the form of two nested coaxially arranged magnet coils. Therefore in a further embodiment of the method according to the invention, the electrically conductive sections of the magnet coils are arranged on two coaxial cylinders with the radii a and b, respectively.

In another preferred embodiment, in step d. a quantity which is proportional to the spatial oscillations of the current density j is selected as a further parameter, in particular, the magnitude of the second derivative of the current density j with respect to the spatial coordinate in the z direction, $|d^2j/dz^2|$.

Also preferred is an embodiment, whereby in step d. a quantity which depends on the axial length l of the magnet coil configuration in the z direction is selected as a further parameter, in particular the integral of the magnitude of the current density j from the end of the magnet coil at l to $z = \infty$:

$$\int_l^\infty |j(z)| dz$$

One embodiment of the inventive method is particularly simple to produce, whereby the electrically conductive sections are made from planar, conductive material of low thickness, in particular from metal foil. The coil parts made from planar, conductive material are considerably better suited to achieve the desired oscillation-poor current density distribution in contrast to a conductor arrangement consisting of wires.

Preferably the electrically conductive sections are separated along predetermined positions by grooves which have a constant and, relative to the conductive sections, small width.

The cutting of the corresponding parts of the magnet coils out of the flat material is most easily achieved in a variant of the method, whereby the electrically conductive sections are made from plate-like material, in particular from copper foil, and are in particular cut using a water jet technique. If the conductive sections have to be arranged on cylinder surfaces, the cut metal foil pieces have afterwards to be bent to the desired radius. In this way, an optimum reproduction of the calculated current density distribution is guaranteed for the individual coil.

However, x or y gradient coil systems generally each consist of four identical individual coils, which are arranged axially and azimuthally symmetrically. In order to maintain the required high precision of the reproduction of the symmetry of these coil systems, in a preferred variant of the method according to the invention, the electrically conductive sections are made from tube shaped material, in particular from cylindrical copper tubes.

Preferably the sections are cut from the tubes using a laser beam technique, whereby, in particular, several magnet coils of the arrangement, preferably two or four, are produced from one tube at the same time.

In order to achieve a fixation of the shape of the cut coil parts, as well as for the purpose of electrical insulation, in an embodiment, the electrical conductive sections are resin impregnated after cutting out of the flat conductive material.

A magnet coil arrangement produced according to one of the above described methods of the invention is also within the scope of the invention.

In particular for single layered magnet coils, application of the variants of the inventive methods is particularly favourable, since in this way continuous current density distributions can optimally be approximated in contrast to multi-layered magnet coils.

Embodiments of the inventive magnet coil arrangement are preferred whereby the magnet coils are gradient coils for the production of a magnetic gradient field.

In a particularly preferred embodiment, the magnet coils are shielded gradient coils, in particular for superconducting magnets for nuclear spin resonance (NMR) tomography.

In the following the invention is described and explained in detail with reference to the embodiments shown in the drawing. The features which can be derived from the description and from the drawing can be applied to other embodiments of the invention individually or collectively in arbitrary combination. Shown are:

Figure 3A:
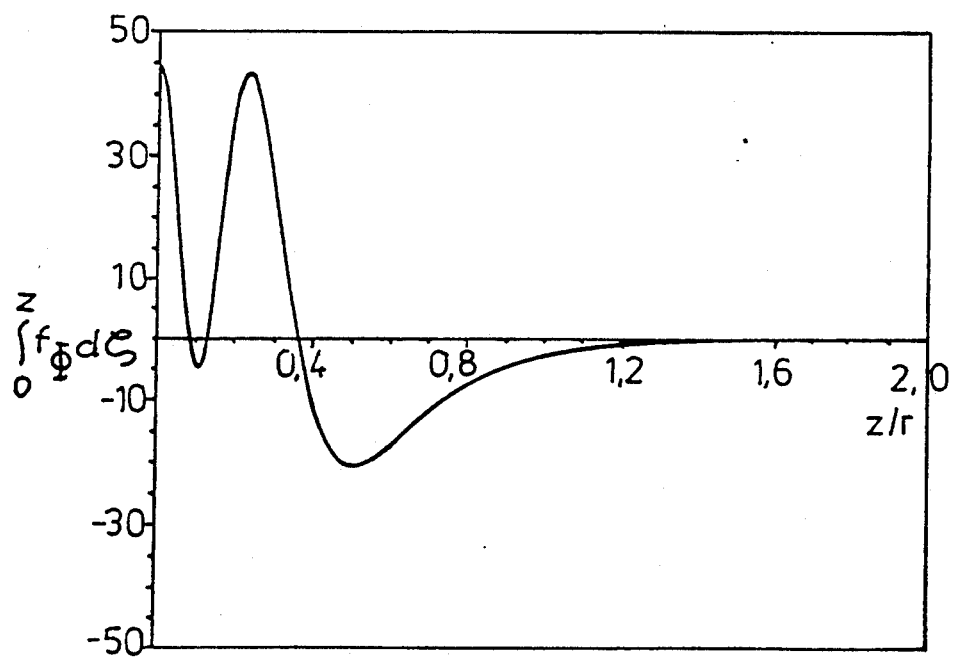
Figure 3B:
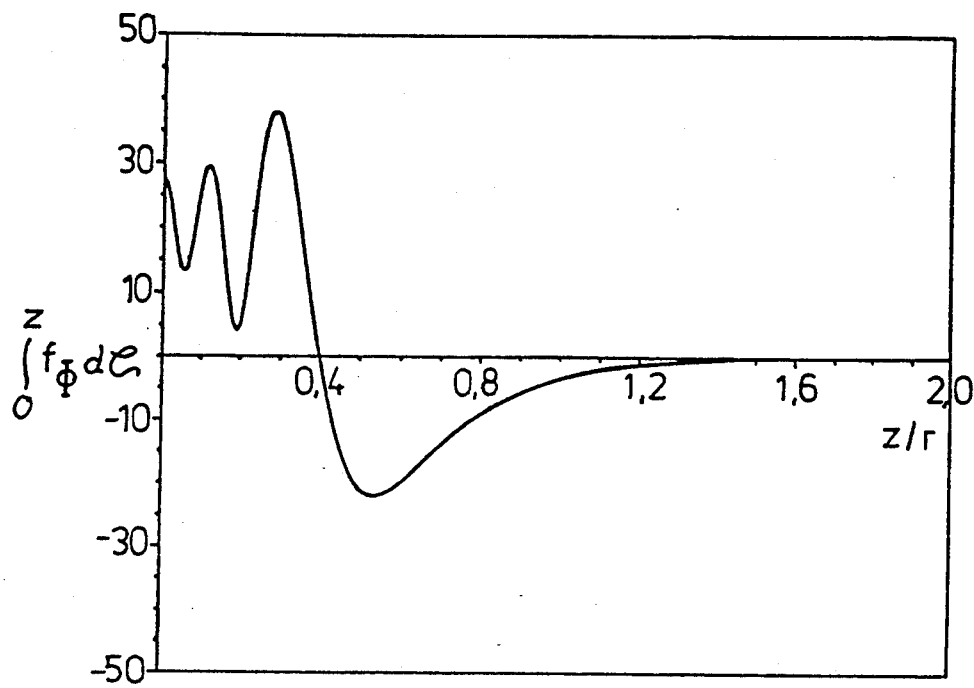
Figure 3C:
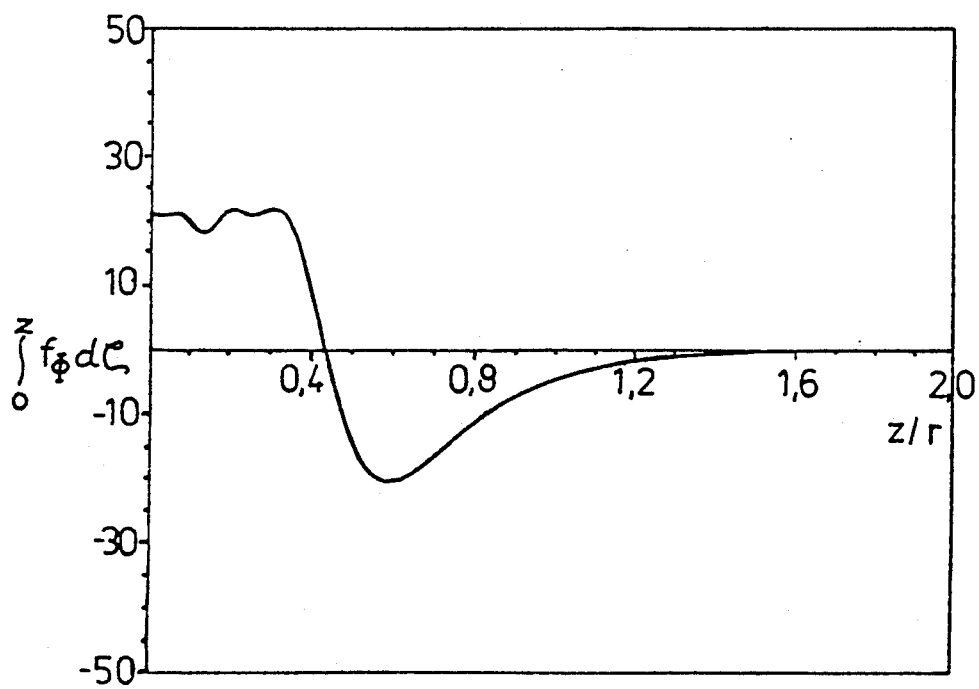
Figure 4A:
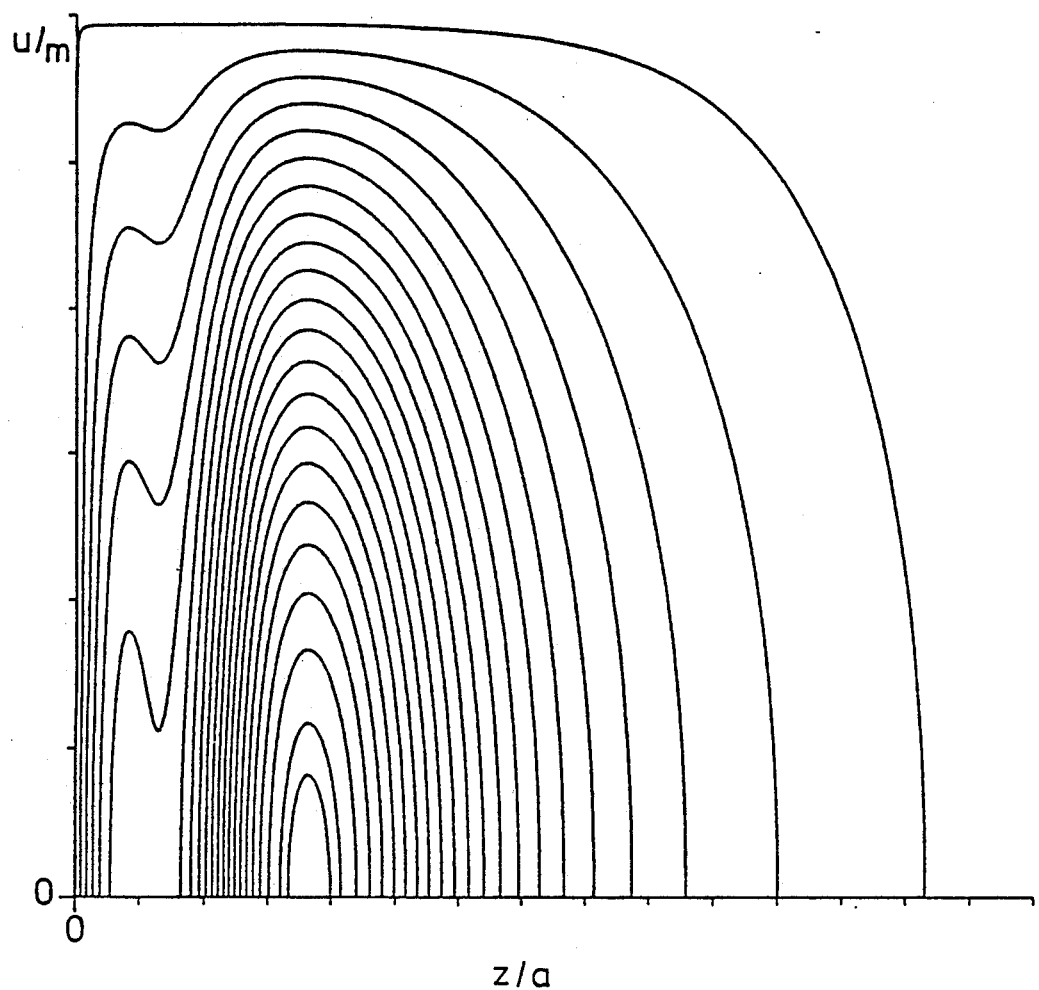
Figure 4:
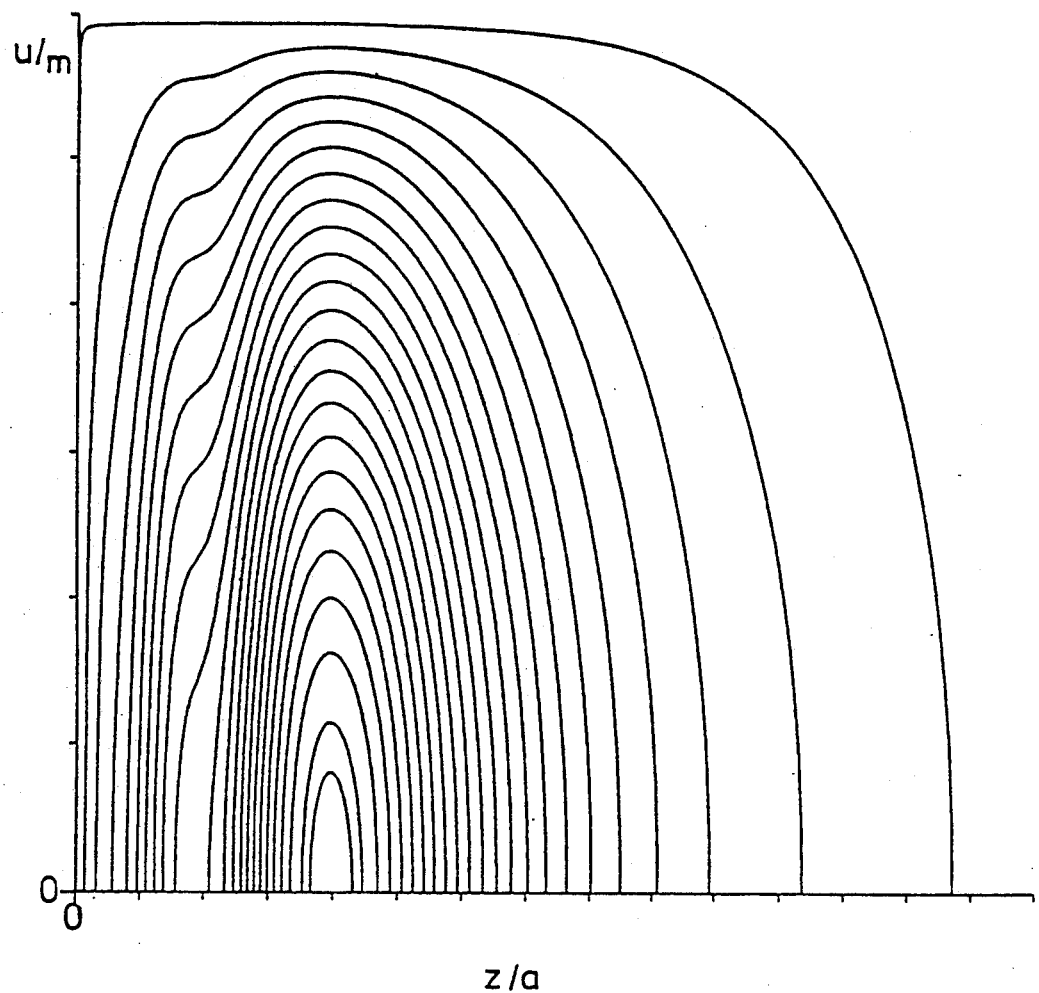
Figure 5A:
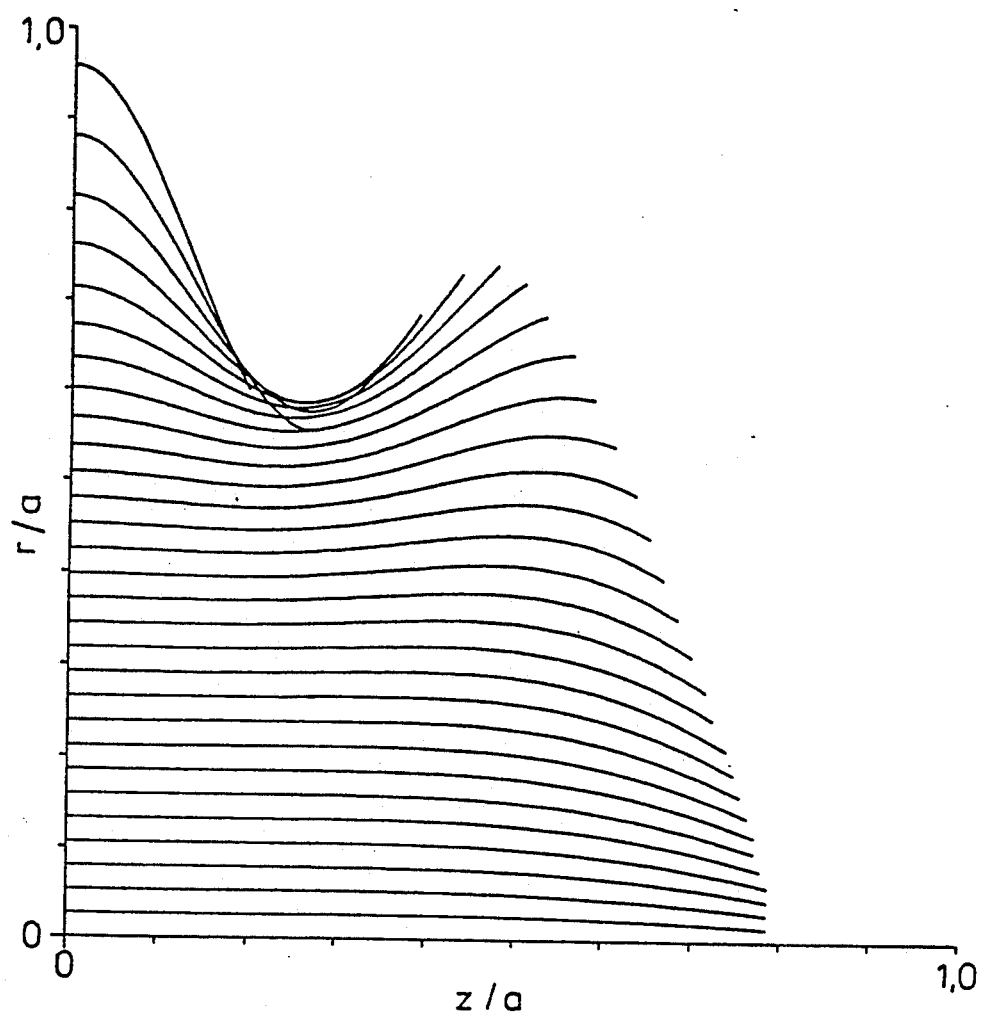
Figure 5:
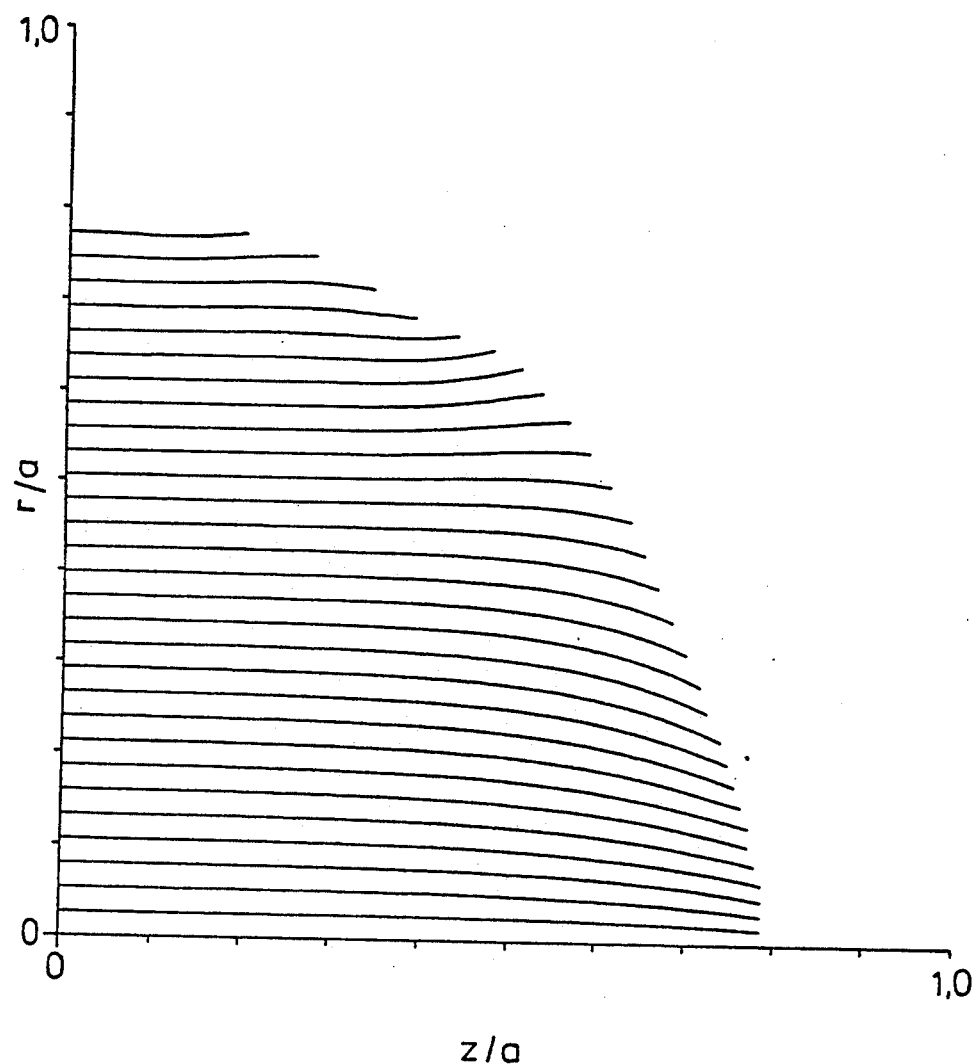
Figure 6A:
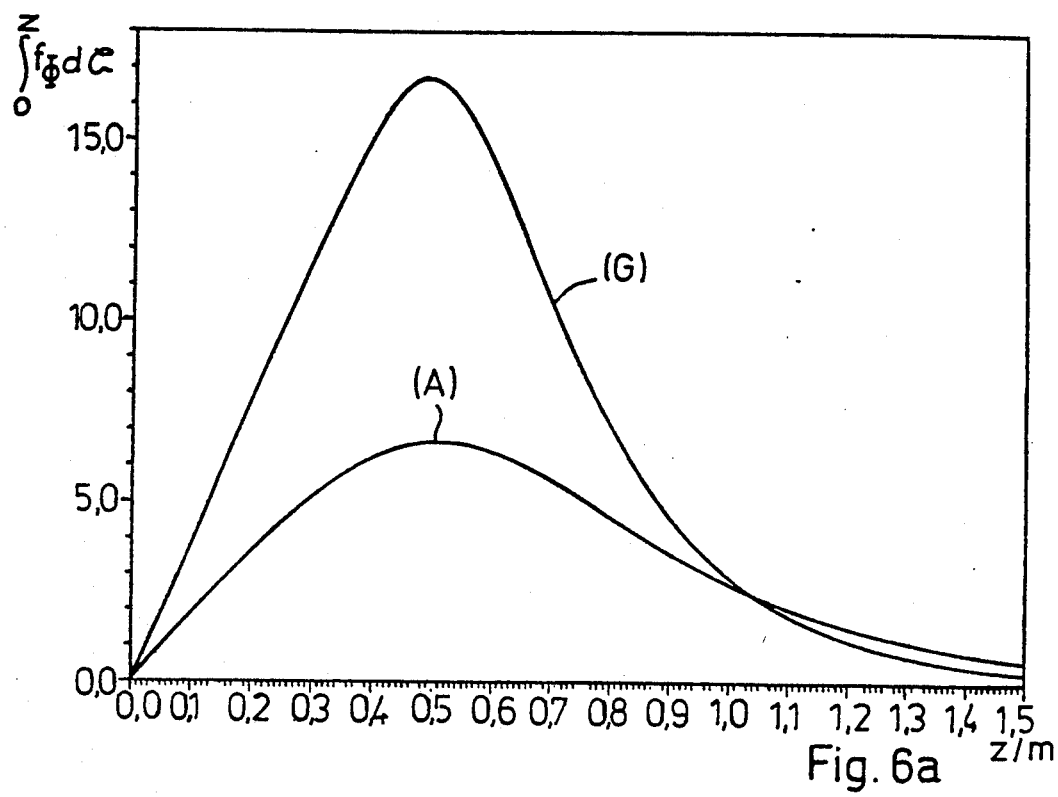
Figure 6B:
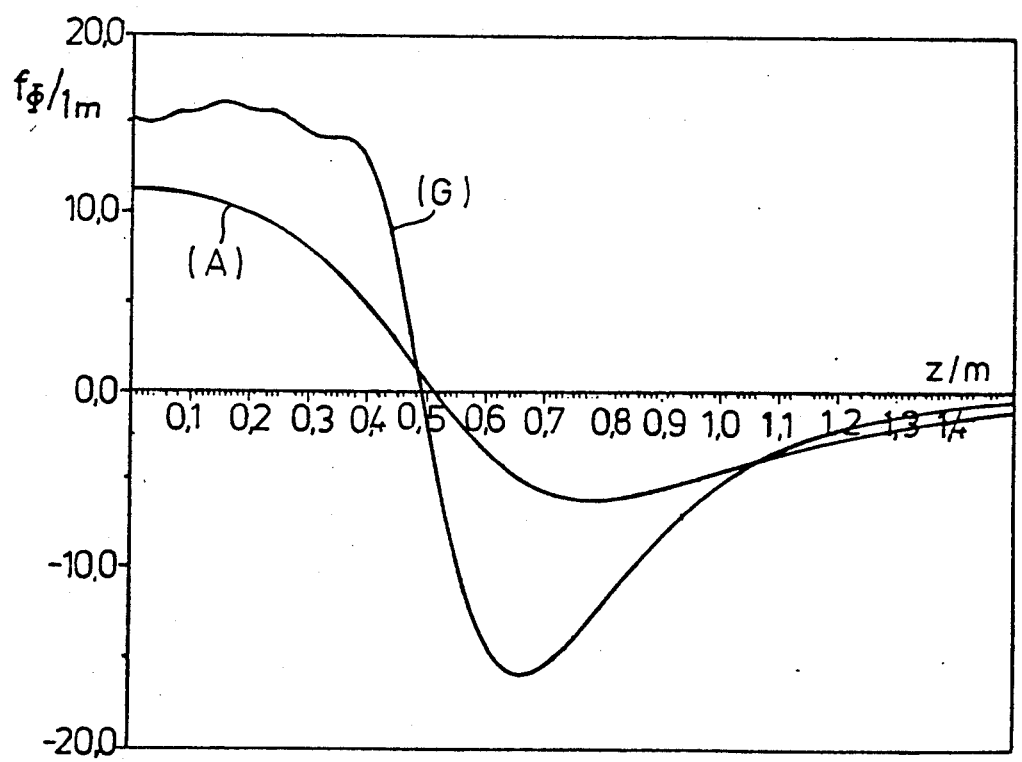

The true current density amplitudes at $\Phi=0$ as a function of spatial coordinate z for FIG. 3a) a classical system with $C_{3,1}=C_{5,1}=0$, whereby the first contributions which are non vanishing for symmetry reasons are externally set to zero;

FIG. 3b) a system which was calculated using an improved calculation method compared to that of EP-A1 0320 285, and which shows the least field error $\Delta B_z$ for all possible combinations $C_{n,m}$ with identical inductance L;

FIG. 3c) a system calculated with the method according to the invention with smoothed current density profile;

FIGS. 4 a)-c) Gradient coils corresponding to the current density amplitudes of FIGS. 3a)-c) or more specific, the positions of the current carrying conductor elements;

FIGS. 5 a)-c) Images of a line grating corresponding to the current density amplitudes of FIGS. 3a)-c) through coils of the shapes of FIGS. 4a)-c);

For one gradient coil or one shielding coil, respectively, the amplitudes at $\Phi=0$ of the $\Phi$ components of FIG. 6a) the current density integrated along the z direction;

FIG. 6b) the non-integrated current densities along the z direction.

Figure 7A:
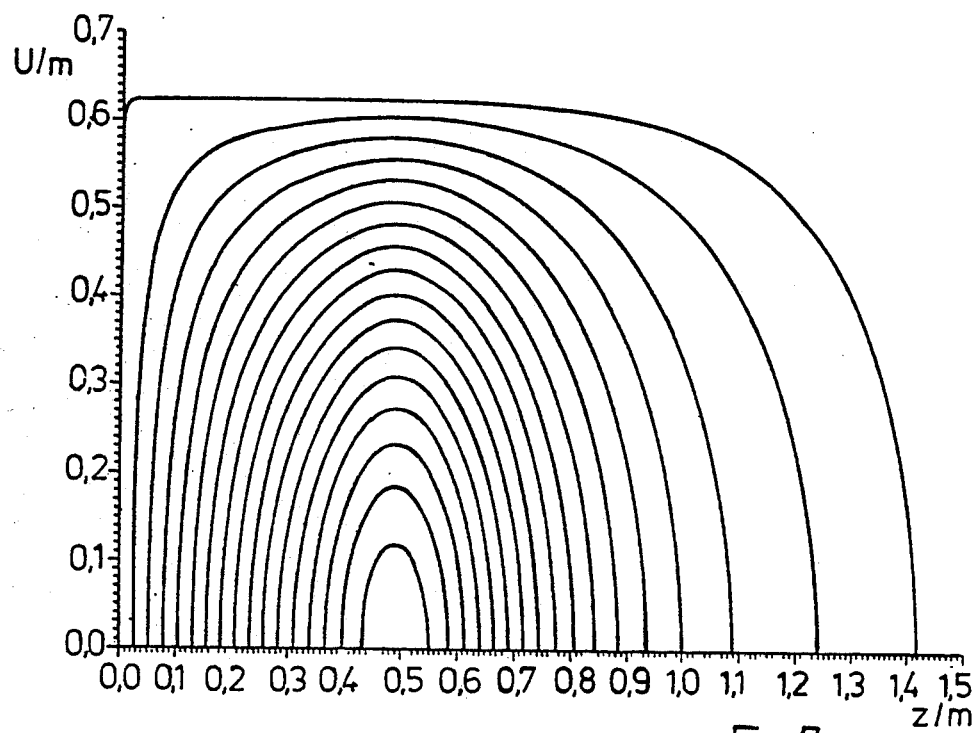
Figure 7B:
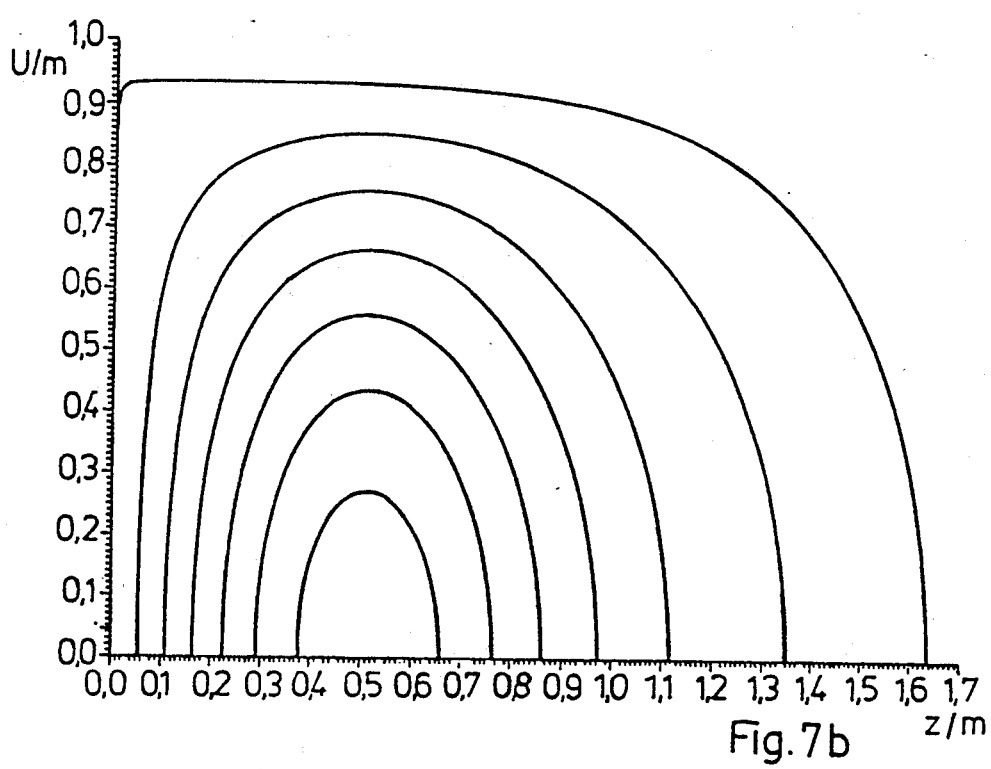
Figure 8:
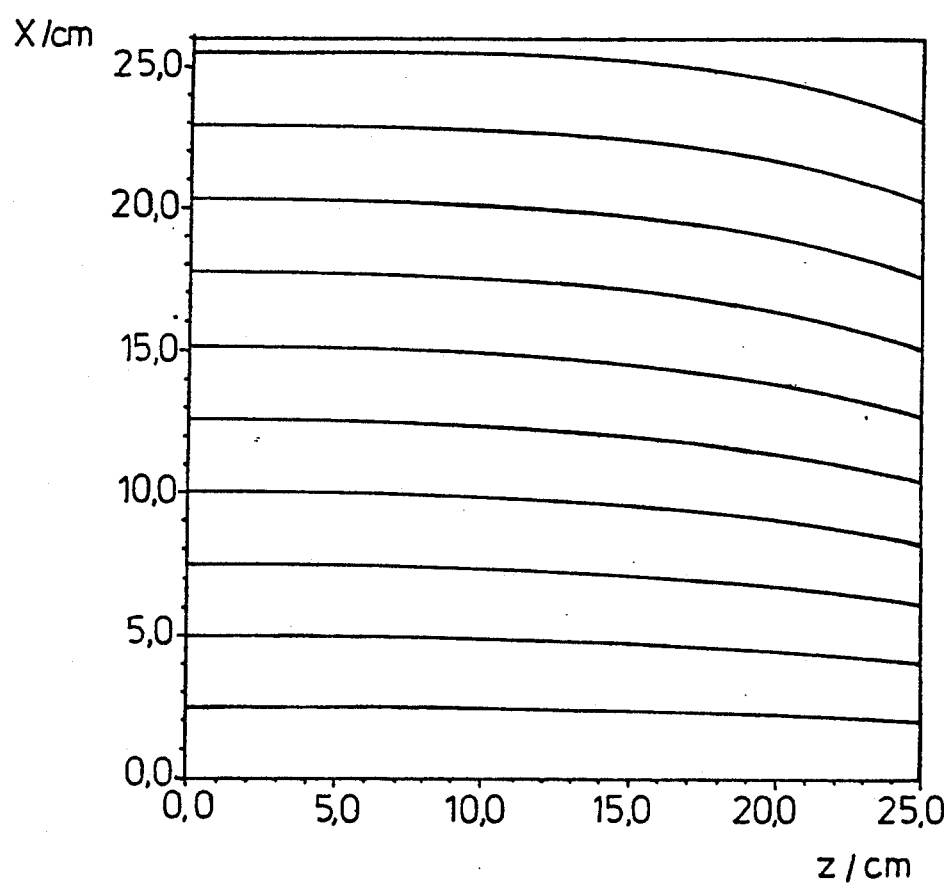

FIG. 7 NMR image of a line grating in z direction with a magnet coil (x gradient coil) according to the invention; and FIG. 7a The circumferential position of the current carrying conductors as a function of the z direction for an x gradient coil;

FIG. 7b The circumferential position of the current carrying conductors as a function of the corresponding shielding coil; and FIG. 8 NMR image of a line grating in z direction with a magnet coil (x gradient coil) according to the invention.

FIG. 8a an x gradient coil;

FIG. 8b the corresponding shielding coil;

DETAILED DESCRIPTION OF THE PREFERRED EMBODIMENT

The invention is based upon the development objective to provide a magnet coil arrangement which, in the specific case, comprises two coaxial, single-layered cylindrical coils, an inner main coil and an outer shielding coil with defined coil radii a<b, which has the following properties:

1. The coil arrangement must create a defined "monochromatic" field distribution with minimum field errors inside a defined inner central volume. With respect to the spherical harmonic expansion of the field distribution (equation 1) discussed below, monochromatic means that essentially one single arbitrary coefficient $C_{n,m}$ defines the desired field. All other field contributions are undesired field errors and must therefore be minimized.

2. As a result, a complete shielding of the coil field in the exterior and as a consequence elimination of space and time dependent interference fields arising from eddy currents should be achieved. Interference fields are induced by the time-variant fields of the coils inside metallic structures which enclose the coils, for example in radiation shields of superconducting coil arrangements.

3. The desired magnet coil arrangement should have minimum inductance L and should as a consequence allow fast potential switching speeds of electromagnetic alternating fields.

4. In addition, a minimum local ohmic resistance of the coil arrangement is desired and as a consequence a merely minute local heating of the system by ohmic losses.

5. A further requirement of the magnet coil arrangement according to the invention consists of the feature of a current density oscillation inside the coils which is as small as possible. The mathematical formulations of the field allow only for the optimized calculation of a spatial function of the current density distribution which is continuous and can be differentiated, but not the calculation of the discrete current portioning of single wires, only which can technically be realized. Therefore it was a development objective leading to the present invention to calculate a "discretizable" current density distribution which can be applied to single wires and which merely produces current density oscillations which are of considerably longer wavelength than the distance between two neighbouring conductors.

A basic distinctive feature of the "STREAMLINE" coils described in the following is a distribution of the current density which is as flat as possible in contrast to classical coils. Mathematically this means an arbitrary increase in the spatial degrees of freedom of the current density, e.g. compared to classical saddle coils, which now allow for a simultaneous optimization of several properties such as inductance L, resistance R, field error $\Delta B_z$ etc., by a variation of the geometry which is coupled to these degrees of freedom. On the other hand, a purely mathematical optimization ("minimization to zero" in contrast to "smaller than a predetermined limit") may lead to resulting functions which are mathematically exact, however, only in rare cases to models which can technically be realized. In general, only systems of equations can be solved exactly, but not systems of inequalities. In the case of the "STREAMLINE" coils, minimization of the inductance alone, i.e. without "damping" boundary conditions, leads to strong oscillations of the current density, as for example also described in EP-A1 0320 285. Such wildly oscillating current densities can, however, be reproduced with discrete single conductors only to a very limited extent.

6. Therefore the current density distribution of the magnet coil configuration according to the invention should eventually be made discrete by flat individual conductors. Compared to discrete wires, which, to a good approximation, correspond to a step function, a planar distribution of the flat current density is the better technical approximation. Not wires of constant cross section are brought to the STREAMLINE position, but flat copper plates are separated along the STREAMLINE positions into conducting circuits. Within, under the present circumstances, the certainly valid assumption of an essentially constant current density distribution within each discrete individual conductor, the approximation of a mathematically calculated continuous current density distribution, also for discrete flat individual conductors, is nearly perfect, when the current density oscillations have, in the worst case, long wavelengths.

For nearly constant current density distribution, a flat discretization is not only optimum with respect to the best agreement with the theoretical model, but also with respect to minimization of the local ohmic resistance. For an uneven distribution of conductors (corresponding to a variable current density) there are regions with exceptionally broad conducting circuits and with exceptionally narrow conducting circuits, which therefore have a high local resistance and, as a consequence, are locally heated to an exceptional extent if current is flowing. This problem vanishes for an even distribution of the current density.

In the following, the physical basis of the formula for the current density j, the inductance L and the magnetic field $B_z$ are discussed, leading to a number of equations which can be applied with the method according to the invention for the production of a magnet coil arrangement.

In a source-free volume of radius R each arbitrary magnetic field may be described by the following series expansion in spherical harmonics:

$$B_z(R,\theta,\Phi) = 1 \cdot \sum_{n=0}^{\infty} \sum_{m=0}^{\infty} R^n P_{n,m}[\cos(\Theta)]\cos(m\Phi - a_m) \cdot C_{n,m} \quad (1)$$

whereby $P_{n,m}[\cos(\Theta)]$ are the Legendre functions with $R < a < b$ and a and b are the radii of two coaxial single-layered, cylindrical coils.

The coefficients $C_{n,m}$, together with the phase angles $a_m$, characterize the field completely.

By the free selection of an arbitrary, finite number N of coefficients $$C_{n(s),m} \quad (2)$$

with $s = 1, 2, \ldots, N$ consecutively and m $m_{set}$ fixed, the $\Phi$-components $j_\Phi(\Phi,z)$[Amperes/meter] of the coil current density as a function of $\Phi$ and z, the inductance L and all remaining, unset coefficients $C_{n,m}$, corresponding to these coefficients, may be calculated simultaneously and independent of each other.

The formulae insure that for each arbitrary set of coefficients the corresponding inductance is minimum and the magnetic field produced by the coil configuration vanishes completely outside the shielding coil with radius b. $b \to \infty$ defines the non-shielded system.

We define as an auxiliary variable the current density $f_\Phi(\Phi,z)$[meter$^{-1}$] standardized to the discrete coil current I[Ampere]:

$$f_\Phi(\Phi,z) = j_\Phi(\Phi,z)/I$$

For the inner coil with radius a[meter] we have then:

$$f_\Phi^{(a)}(\phi,z) = \frac{1}{\mu_0} \cos(m\phi - a_m) \cdot \sum_{s=1}^{N} i^{n(s)-m} \cdot H_{n(s)}^{(m)} \cdot \quad (3)$$

$$\begin{cases} F\cos_{n(s)}^{(m)}\left(\frac{z}{a}\right) & \text{for } n - m \text{ even} \\ i \cdot F\sin_{n(s)}^{(m)}\left(\frac{z}{a}\right) & \text{for } n - m \text{ odd} \end{cases}$$

For the outer shielding coil with radius b [meter] we have:

$$f_\phi^{(b)}(\phi,z) = \frac{1}{\mu_0} \cos(m\phi - \alpha_m) \cdot \sum_{s=1}^{N} i^{n(s)-m} \left(\frac{a}{b}\right)^{n(s)+2} \quad (4)$$

$$H_{n(s)}^{(m)} \begin{cases} F\cos_{n(s)}^{(m)}\left(\frac{z}{b}\right) & \text{for } n - m \text{ even} \\ i \cdot F\sin_{n(s)}^{(m)}\left(\frac{z}{b}\right) & \text{for } n - m \text{ odd} \end{cases}$$

As a result, the inductance L of the coil configuration is $$L = \frac{1}{\epsilon_m} \cdot \frac{\pi^2}{\mu_0} \cdot \sum_{s=1}^{N} H_{n(s)}^m \cdot C_{n(s),m} \cdot a^{n(s)} mi t\epsilon_m = \begin{cases} 1 \text{ fur } m \geq 1 \\ \frac{1}{2} \text{ fur } m = 0 \end{cases} \quad (5)$$

For all field coefficients, set as well as unset ones, we have:

$$C_{n,m} = a^{-n} \sum_{s=1}^{N} H_{n(s)}^{(m)} \cdot D_{n,n(s)}^{(m)} \quad (6)$$

With the normalized current densities $$F\cos_n^{(m)}(z) = \frac{1}{(n+m)!} \int_0^\infty \zeta^{n+1} \cos(z\zeta) \cdot \frac{1}{T_m(\zeta)} d\zeta \quad (7)$$

and $$F\sin_n^{(m)}(z) = \frac{1}{(n+m)} \int_0^\infty \zeta^{n+1} \sin(z\zeta) \cdot \frac{1}{T_m(\zeta)} d\zeta \quad (8)$$

and the following abbreviations:

$$A_n^{(m)} = \int_0^\infty \zeta^n \frac{K'_m(\zeta)}{T_m(\zeta)} d\zeta; \frac{T_m(\zeta)}{K'_m(\zeta)} \} \text{BESSEL-FUNCTION} \quad (a)$$

$$D_{n1,n2}^{(m)} = \frac{i^{n1+n2-2m}}{(n_1+m)!(n_2+m)!} \left[1 - \left(\frac{a}{b}\right)^{m+n2+3}\right] A_{n1+n2+2}^{(m)} \quad (b)$$

with the elements of a symmetric N×N matrix [μ]

$$\mu^{(m)}_{s1,s2} = D^{(m)}_{n(s1),n(s2)} \quad (c)$$

with $1 \leq s1 \leq N$ and $1 \leq s2 \leq N$ and the elements $\nu^{(m)}_{s1,s2}$ of the corresponding inverse matrix [ν] with $[\nu]\cdot[\mu]=[1]$ (unit matrix)

$$H_{n(s)}^{(m)} = \sum_{l=1}^{N} \nu_{s,l}^{(m)} \cdot C_{n(l),m} \cdot a^{n(l)} \quad (d)$$

In FIG. 1, some of the relevant normalized current densities, i.e. the φ-components of the current density amplitude as a function of z, corresponding to the set coefficients $C_{1,1}$; $C_{3,1}$; $C_{5,1}$ and $C_{7,1}$ are given for the desired coefficient $C_{1,1}$, describing a monochrome X or Y gradient, respectively. The sums of the current densities of the two coil radii a and b are obtained as a superposition according to equation (3) and (4), respectively. Only the set coefficients contribute to the current densities.

The current densities ensure a shielding of the outside from the magnetic field B as well as also the minimum, not just small, inductance L of the coil configuration. In contrast to the above mentioned prior art methods, apart from the minimum inductance also additional boundary conditions may be introduced in an analytical way, preferably the minimum field error ΔB and a weakly oscillating current density.

The simple formulae of equations (2) to (6) are particularly suited for fast numeric optimization routines. An essential improvement of the invention over prior art methods is apparent from the optimization diagram shown in the appendix. Accordingly, in a first step the desired boundary conditions as inductance L, field distribution of the magnetic field $B_z$, current density oscillations and coil length l are entered. In a second step, the coefficients according to equation (2) are entered. After this, independent calculation of the current density j according to equations (3) and (4), inductance L according to equation (5) as well as of the magnetic field $B_z$ according equations (1) and (6) is performed. Finally, the computed values are compared to the predefined boundary conditions for field error, inductance, current density distribution, oscillation and coil length. If the obtained solutions fulfill the boundary conditions, the program stops; if the boundary conditions are not fulfilled, a new program run in the second step with entering of the coefficient set may follow.

In the following, we will go into the definition of the field error $\Delta B_z$ in detail:

According to equation (1), the field B is completely defined; with the spherical coordinates (R,Θ, Φ) and cartesian coordinates (x,y,z) we have $$x = R \cdot \sin(\Theta) \cdot \cos(\Phi).$$

An ideal monochromatic x gradient is defined by $$B_z(R,\Theta\Phi) = C_{1,1} \cdot x$$

According to equation (1), this corresponds to the term $n=m=1$ $\alpha_m=0$:

$$b = C_{1,1} \cdot R^1 \cdot P_1^1[\cos(\Theta)] \cdot \cos(\Phi)$$
$$= C_{1,1} \cdot R^1 \cdot \sin(\Theta) \cdot \cos(\Phi)$$
$$= C_{1,1} \cdot x$$

Therefore all other $C_{n,m}$ yield error contributions. The coefficient $C_{1,1}$ hence generates the x gradient $dB_z/dx$ (or the y gradient $dB_z/dy$). All other $C_{n,m}$ contribute to the field error ΔB, as for example the coefficient $C_{3,1}$, generating the third-order gradient $d^3B_z/dx^3$.

By an appropriate selection of the coil geometry, all even orders of the coefficients $C_{n,m}$ in n vanish, and as a consequence only terms with m=1 and n=odd remain. In general, coil systems of this basic type consist of four symmetrically arranged, identical individual coils. They are axially symmetric with respect to z=0 and azimutally antisymmetric with respect to Φ=180°. For the total system all coefficients with m≠1 vanish because of the azimuthal current density profile being proportional to cos(Φ) and all coefficients with even n vanish because of the selected axial and azimutal symmetry.

Merely for symmetry reasons, only the following field contributions exist:

$B_{1,1}, B_{3,1}, B_{5,1} \ldots$ etc.

$B_{1,1}$ is the desired contribution, whereas all other contributions are undesired errors.

The total error for this system is defined at each position $(R,\Theta,\Phi)$ by $$\Delta B_z(R,\Theta,\Phi) = \Sigma_{n=3,5,\ldots} C_{n,1} \cdot R^n \cdot P_n^1[\cos(\Theta)] \cdot \cos(\Phi)$$

The desired field $B_{1,1}$ as well as also the total absolute error $\Delta B_z$ vary with $\cos(\Phi)$. It is therefore sufficient, to investigate the error contributions inside the plane $(R,\Theta,\Phi=0)$, since they represent the relative error within the entire volume.

As boundary condition of the numerical optimization procedure for the tolerable error contribution inside the field volume (measuring volume) of interest, a number (not a function!) has to be predefined. This may, for example, be the volume integral of the field errors in relation to the volume integral of the linear gradient, leading, however, to a numerically time-consuming operation which is not suitable for practical means.

If the measuring volume of interest is a sphere with radius R, calculation of the field errors on the surface of the sphere or along the circumference with radius R in the plane $\Phi=0$ is sufficient. In many cases the peak-to-peak difference is sufficient as a numerical measure for the error.

However, it must explicitly be stressed that for each specific application of the coil system to be optimized, which coil system is defined by the desired field, the field volume of interest (sphere, cylinder, disk, etc.) and by a specific, three-dimensional error function, an appropriate boundary condition for the field error may be formulated, so that the calculated coil system follows the preconditions optimally. Therefore $$F = \text{Max}[f(\theta)] - \text{Min}[f(\theta)] \text{ mit}$$
$$f(\theta) = \Sigma_{n=3,5,\ldots} C_{n,1} \cdot R^n \cdot P_n^1[\cos(\Theta)]$$

may be given as an example for the boundary conditions of a numerical field error F(peak-peak).

The current densities j and the resulting auxiliary functions $f_\Phi(\Phi,z)$ are defined according to equations (3) and (4). The amplitudes of the second derivatives of equation (3) and (4) with respect to z are a measure for current density oscillations in z direction and therefore via the equation of continuity also in $\Phi$-direction. For example, the peak-peak difference of the second derivative may again be selected as a numerical measure which is suitable for the numerical optimization.

As a numerical boundary condition for the maximum permissible coil length l it is more appropriate to select a suitable upper limit for the integral of the current density from l to "infinity".

From the above discussion it is apparent that a weakly oscillating current density distribution is superior to any strongly oscillating distribution. The beet reproduction of the flat current distribution can be obtained by cutting from copper plates in a Computer Numerical Controlled [CNC] machine grooves of constant width so that the streamline-shaped conductors remain.

Figure 1A:
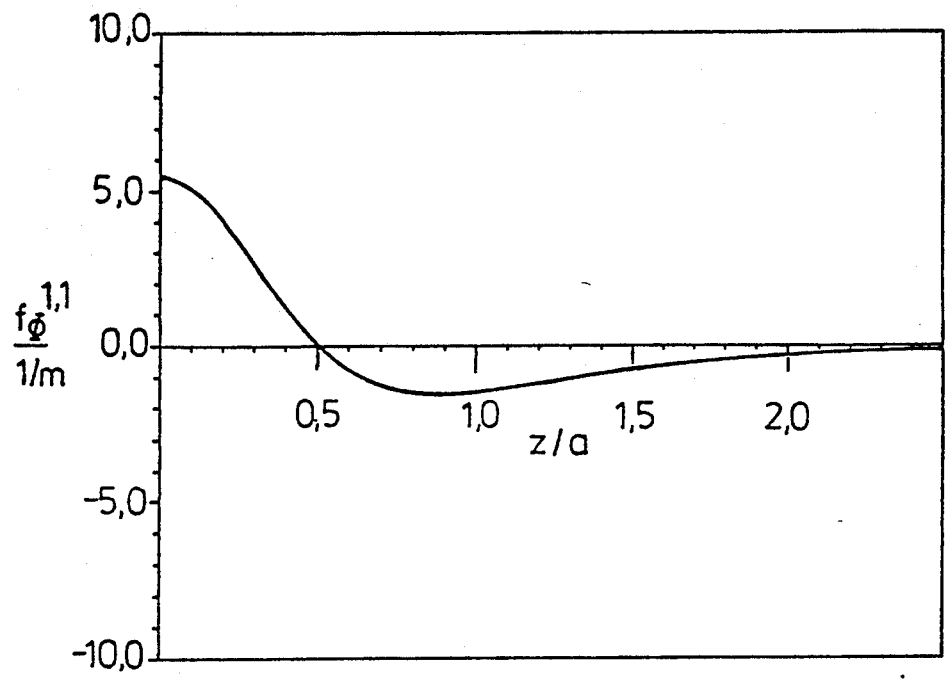
FIG. 1 $\Phi$-components of current density amplitudes as a)-d) a function of the spatial coordinate z calculated according to formula 7 a)$C_{1,1}$; b)$C_{3,1}$; c)$C_{5,1}$; d)$C_{7,1}$.
Figure 1B:
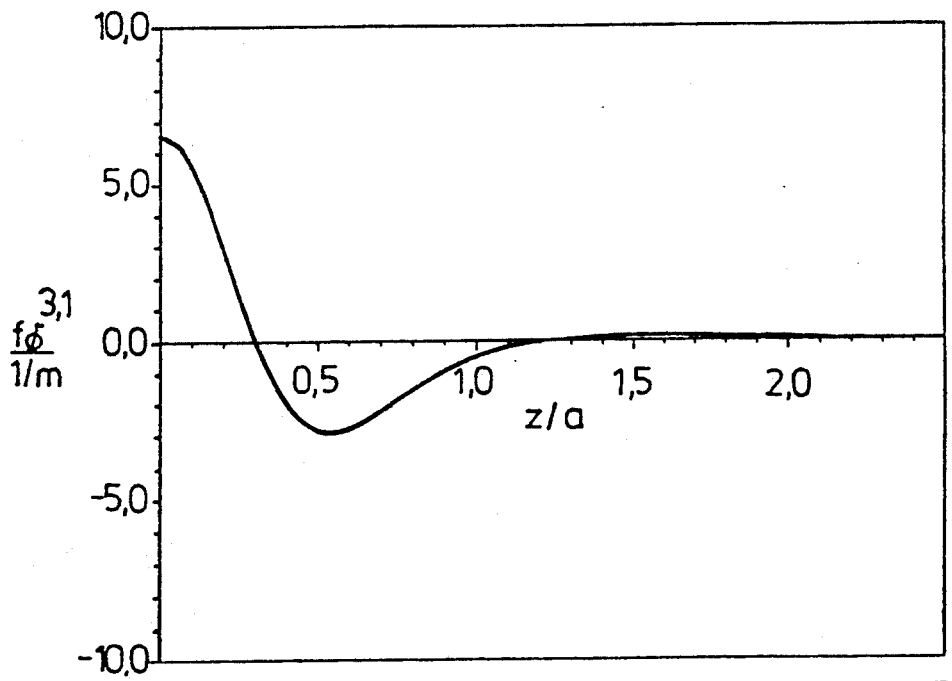
Figure 1C:
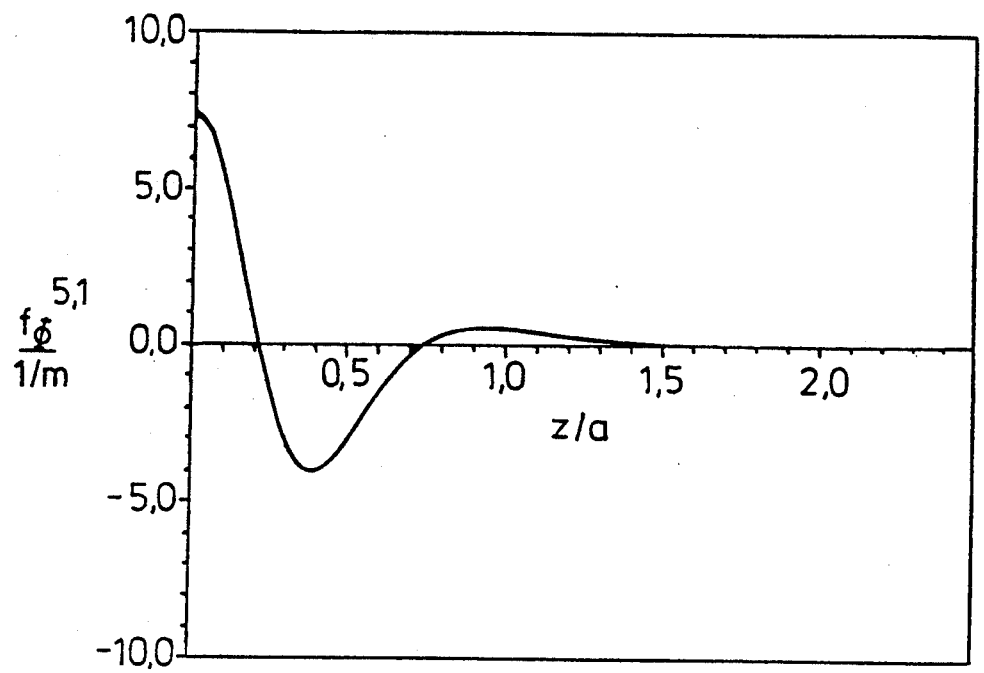
Figure 1D:
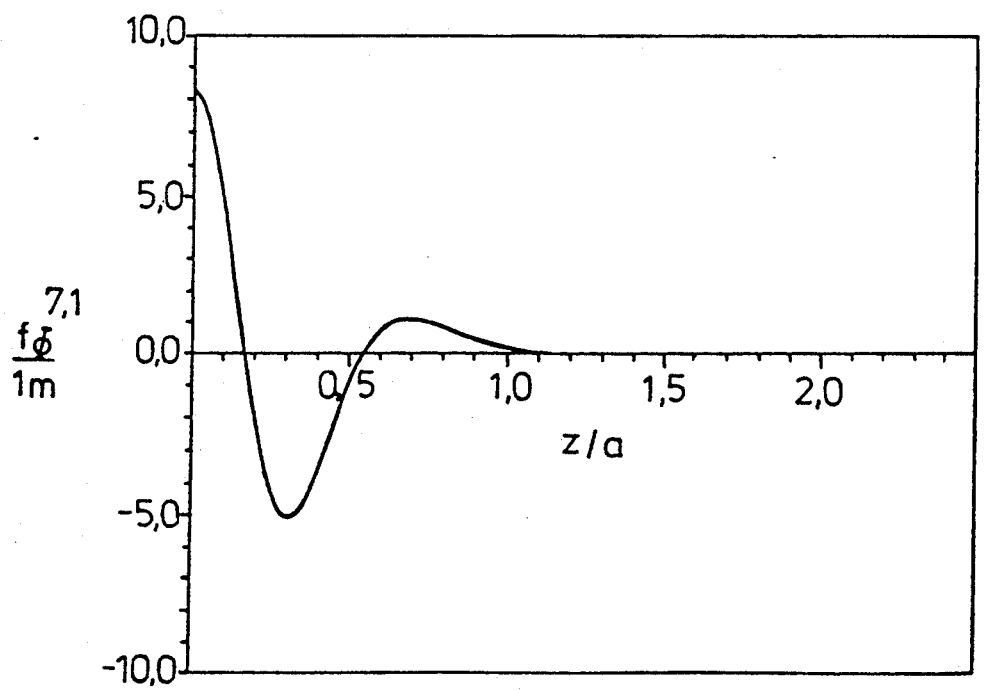
Figure 2:
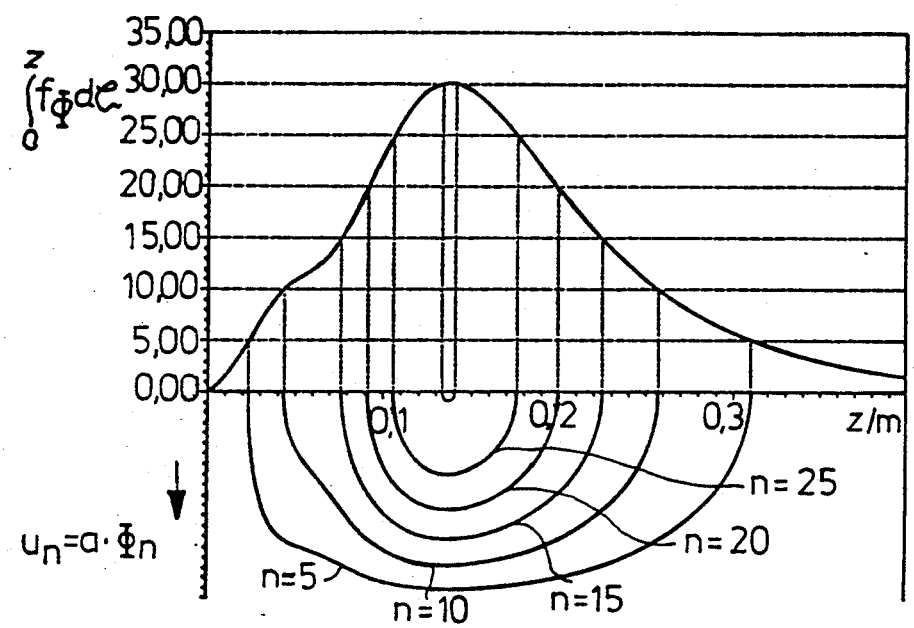
FIG. 2 The relation between integrated current density and corresponding conductor arrangement as a function of the spatial coordinate z.

FIG. 2 explains the correlation between integrated current density and corresponding arrangement of conductors, if the current density varies azimutally as $\cos\Phi$. The upper part shows the z-integral of the $\Phi$-components of the current density at $\Phi=0$ as a function of the z-axis, whereas the lower part shows the windings of the coil (actually half-coil) producing the field, whereas the distances of windings each correspond to 5 current units on the current scale pointing upwards.

The auxiliary formula to calculate the groove positions=(coil radius) * $\Phi_n(z)$ of the $n^{th}$ groove, as displayed in the lower part of FIG. 2, is:

$$\Phi_n(z) = \arccos\left(n \cdot I/\int_0^z f_\Phi(\Phi=0,z)d\zeta\right)$$

$$\leq 1,0$$

Since the grooves should not fall below a minimum of about 1 mm for safety reasons to avoid short circuits, it is essential that the conductor distribution is homogeneous, in particular for the most interesting systems consisting of coils with many conductor circuits (strong field) which, however, are in this case narrow. This means that the current density has to be constant, since otherwise the narrow conductor circuits cannot be realized anymore for ohmic reasons. A maximum packing factor should therefore be reached. The way out which seems conceivable at first thought, to solve this problem by stronger copper plates, i.e. radial strengthening of the coils, does not work since in this way the ratio of the radii a/b of the coaxial coils is implicitly increased and the system properties degrade dramatically with high powers of this ratio.

The development objective to maximize the minimum conductor cross section of the coils and to simultaneously reproduce the calculated current density in the best possible way and with a radial extent of the coils which is as small as possible, is achieved by several independent steps and procedures: Numerical reduction of the current density oscillation in the z-direction as a prerequisite of equidistant, broad conductor circuits in the z-direction; flat reproduction of the current density with as narrow as possible isolation grooves between as equidistant as possible current circuits by means of CNC-cutting processes from flat full material; bubble-free and fissure-free electrical insulation of neighbouring conductor circuits; flat shape-stabilizing of the conductor-circuit groove-spirals; as well as shape-stabilization of the plates which have to be bent in the radial direction by (radially) as thin as possible insulation layers (2/10 mm) by means of vacuum impregnation and hot pressure processes of appropriate resin combinations, serving as electrical insulation as well as to avoid radial bulges of the conductor-groove-plates during the bending procedure through appropriately matched mechanical loading.

After cutting of the grooves, the plates are resin impregnated and afterwards bent to the desired radius. In this way, an optimum reproduction of the desired current density distribution for the individual coil is insured.

X- and Y-gradient coil systems consist of in general 4 or 2, respectively, identical individual coils, which are arranged with axial and azimuthal symmetry. Apart from the reproduction of the current density distribution in the individual coil, the exact reproduction of the symmetry is in this case also of at least equal importance.

For smaller 4-coil systems, 2 axially symmetric coils are therefore simultaneously cut out of one copper plate. As a consequence, this symmetry has CNC-precision from the very beginning. The coils may in general be cut from copper plates using prior art water jet technique.

A CNC-cutting of all four individual coils of a system is optimum, i.e. of each four individual coils for the inner gradient coil and of the four individual coils for the outer shielding coil, from one single copper hollow cylinder. In this case, only the coaxial and the axial symmetry of the two cylinders remain to be adjusted externally. In this case, a laser cutting technique is recommended.

In FIGS. 3a to c the true current density distributions as a function of z-direction of three magnet coil systems are compared for a tesseral, shielded gradient. The coil systems have each identical gradient strength, identical dimensions and identical minimum inductance with respect to the boundary conditions.

FIG. 3a shows the results for a classical system with $C_{3,1}=C_{5,1}=0$. The first for symmetry reasons non-vanishing contributions where externally set to zero. Extremely strong oscillations of the current density amplitudes inside the field range of interest within the measuring volume are observed.

The results shown in FIG. 3b originate from a calculation procedure which starting from the procedure described in EP-A1 0320 285 comprises additional improvements so that among all possible combinations $C_{n,m}$ with identical inductance L and identical further boundary conditions, a coil arrangement with minimum error results. The resulting current density oscillations are already recognizably smaller than those of the solution according to FIG. 3a.

Finally, in FIG. 3c the result of the optimization procedure according to the invention with nearly smooth current density profile is displayed. With identical inductance L and identical remaining boundary conditions, a considerably better smoothing of the current density is achieved compared to the other methods, whereas the linearity error is only insignificantly increased.

Figure 4C:
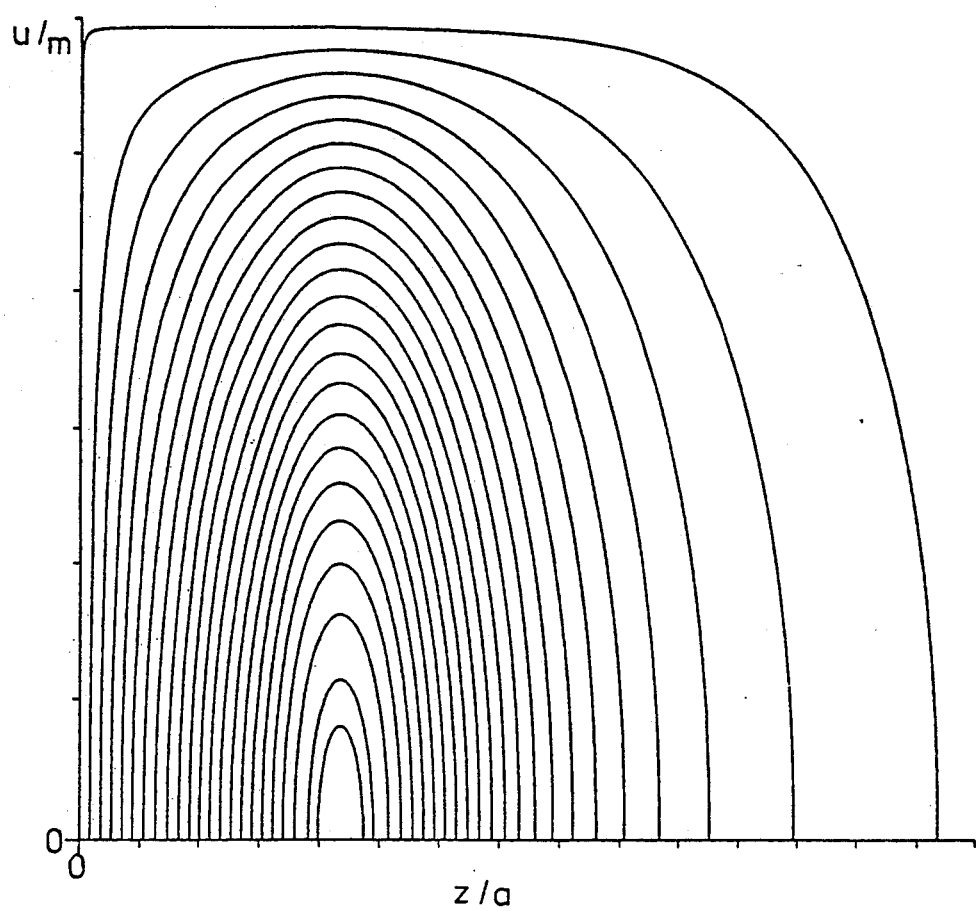
Figure 5C:
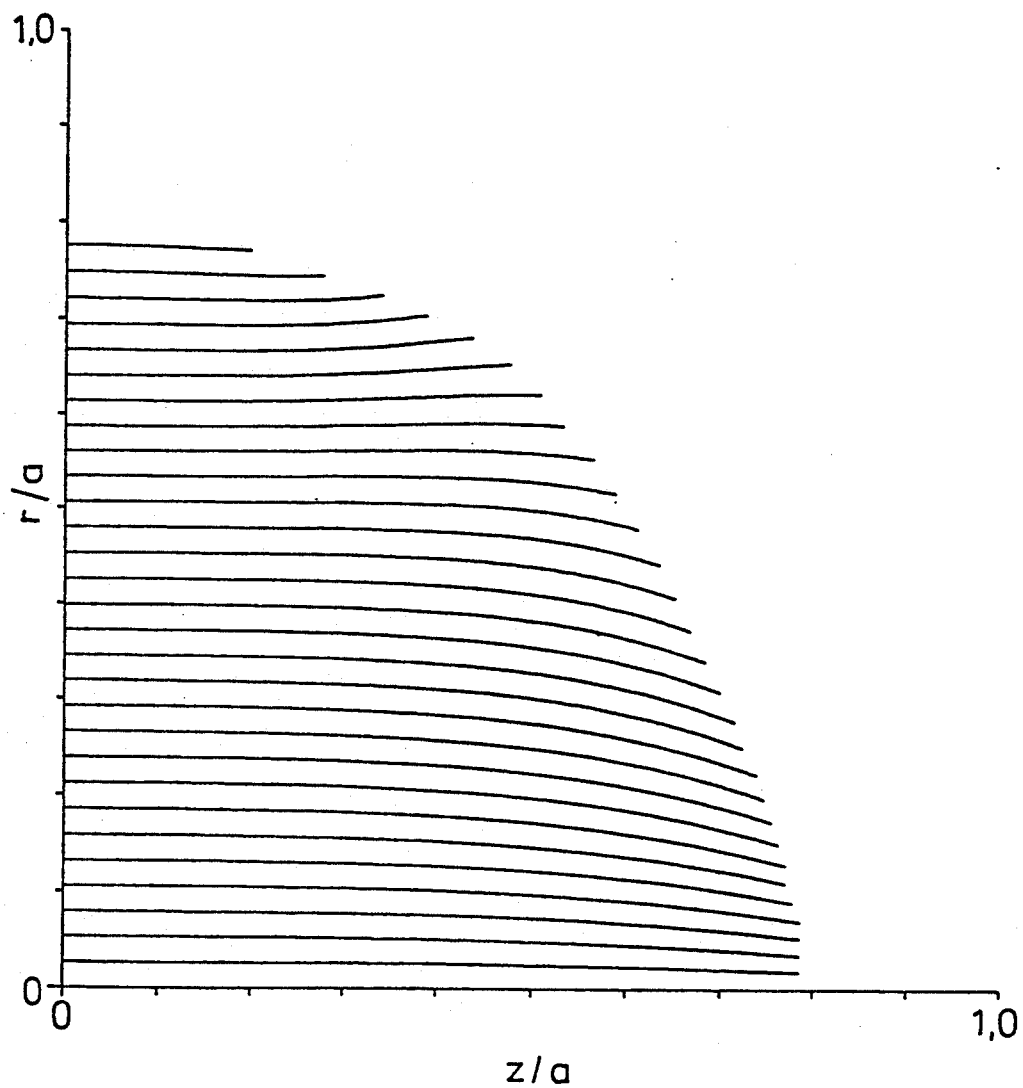

In FIGS. 4a to c, the gradient coils corresponding to the current density amplitudes of FIGS. 3a to c are shown (more specific, the position of the conductor elements through which the current flows). In FIGS. 5a to c the images of a line grating by coils with the shapes of FIGS. 4a to c corresponding to the current density amplitudes of FIGS. 3a to c are shown.

In the following, a complete and typical set of data is given for the calculation of a shielded tesseral gradient system (X and Y, respectively) with "weakly oscillating" current density, minimum linearity error for a given inductance L, which itself is minimum in consideration of all boundary conditions, and without limiting the length of the coils:

SET OF DATA radius of the gradient coil $a=0.4$ m
radius of the shielding coil $b=0.6$ m
gradient strength $C_{1,1}=5$ mGauss/(m*A)
inductance $L=0.512$ mH
linearity error (peak-peak) of 8.6% on a spherical surface with radius $r=(2/3)*a$
set coefficients:

$C_{01,1} = +0.5000E-04$ $T/(m^1*A)$ $C_{03,1} = -0.1638E-04$ $T/(m^3*A)$ $C_{05,1} = +0.6487E-04$ $T/(m^5*A)$ $C_{07,1} = +0.8384E-04$ $T/(m^7*A)$ $C_{09,1} = +0.1348E-03$ $T/(m^9*A)$ $C_{11,1} = +0.6056E-03$ $T/(m^{11}*A)$ $C_{13,1} = +0.8313E-03$ $T/(m^{13}*A)$ $C_{15,1} = +0.4535E-02$ $T/(m^{15}*A)$ $C_{17,1} = +0.3578E-01$ $T/(m^{17}*A)$

The results of the calculations are graphically represented in FIG. 6 through FIG. 8.

FIG. 6a shows the amplitudes of the $\Phi$-components of the current densities of the gradient coil (G) or shielding coil (A), respectively, which are integrated in z-direction, whereas FIG. 6b shows the corresponding current densities themselves, i. e. the derivatives of the curves with respect to z represented in FIG. 6a.

In FIG. 8, the calculated NMR image of a line grating with a line separation of 2.5 cm is shown derived by the calculated x gradient coil according to the invention.

FIG. 7a shows the positions of the components of a current carrying gradient coil, more specifically the circumference U of an unwound cylinder section of a half-coil with radius $a=0.4$ m along the z-direction. Finally, FIG. 7b shows correspondingly the positions of the current-carrying elements of the corresponding shielding coil with radius $b=0.6$ m.

APPENDIX
Flow Diagram:

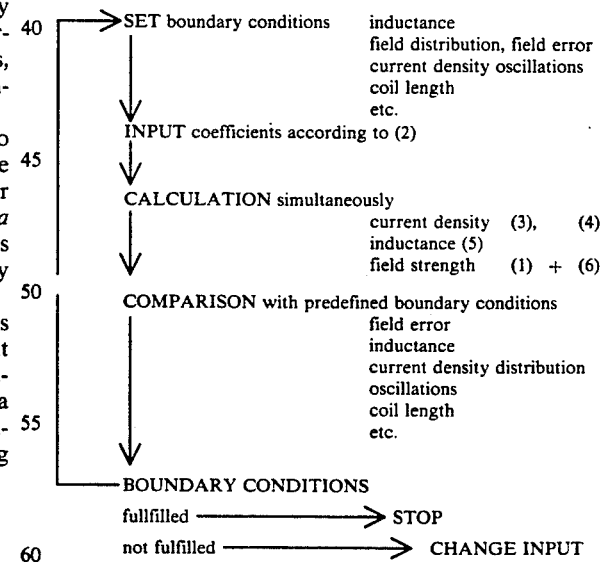

We claim:
1. A method for the production of a magnet coil configuration with one or more current carrying magnet coils comprising electrically conducting sections, whereby the electrically conducting sections are located on at least one coaxial cylinder, or parallel plane, the sections effecting a quasi-continuous distribution of the current density j and thereby creating a magnetic field B with a predetermined field distribution within a measuring volume inside the magnet coil configuration and whereby the magnet coil has a minimum inductance L in comparison to all possible coil configurations on the coaxial cylinders or planes, respectively, which produce this field distribution, the method comprising selecting the electrically conducting sections such that when a current is flowing through the magnet coils a particular current distribution results, said current distribution being determined by the following steps:

a. Expanding a field distribution of a z component $B_z$ of the magnetic field B in a series with a coefficient $C_{n,m}$;
b. Defining a maximum permissible field error $\Delta B_z max$ within the measuring volume or a partial volume as a function $f_1$ of the coefficients $C_{n,m}$;
c. Fixing of a permissible range of values $[L^{min}, L^{max}]$ for an inductance L and defining L as a function of the coefficients $C_{n,m}$;
d. Defining at least one further technically relevant parameters of the magnet coil configuration as a function $f_2, f_3, \ldots$ etc. of the coefficients $C_{n,m}$;
e. Fixing of permissible ranges of values $[f_2^{min}, f_2^{max}]$, $[f_3^{min}, f_3^{max}]$, . . . etc for the further parameters $f_2$, $f_3, \ldots$;
f. Setting of predetermined fixed values for a part of the coefficients $C_{n,m}$;
g. Calculating continuous current densities j, with j defined as a function of the coefficients $C_{n,m}$, on the coaxial cylinders or planes, respectively, using these values;
h. Calculating the inductance L using these values;
i. Calculating a finite number of further coefficients $C_{m,n}$ with increasing indices n,m;
j. Calculating the field distribution of the magnetic field $B_z$ inside the measuring volume or a partial volume and determining a field error $\Delta B_1 = f_1 (C_{n,m})$;
k. Calculating the further parameters $f_2(C_{n,m})$, $f_3(C_{n,m})$, . . . etc. using these values;
l. Comparing the calculated field error $\Delta B_z$ with the permissible maximum value $\Delta B_z^{max}$, the calculated inductance L with limits of the permissible range of values ($L^{min}$, $L^{max}$) and the calculated further parameters $f_2, f_3, \ldots$ etc. with limits of the permissible ranges of values ($f_2^{min}, f_2^{max}$), ($f_3^{min}, f_2^{max}$), . . . etc;
m. If all limits of the permissible ranges are obeyed: selecting one of:
   m1) accepting the result and using the continuous current densities j for a technically realizable quasi-continuous current distribution; and
   m2) repeating steps a. to l. with further restricted permissible limiting values and/or with an enlarged set of set coefficients $C_{n,m}$ according to f.;
n. If at least one of the limits of the permissible ranges is exceeded:
   n1) Setting of new values for the predetermined coefficients $C_{n,m}$ either manually or by using a prior art optimizing algorithm;
   n2) Repeating steps as necessary, from g. to n.

2. The method according to claim 1 wherein in step m2) the permissible limits are restricted and/or the set of relevant coefficients $C_{n,m}$ is enlarged so many times until the results no longer significantly change if the limits are further restricted.

3. The method according to claim 1 wherein the field error $\Delta B_z$, the inductance L or one of the further technically relevant parameters is purposefully optimized by successive restriction of the permissible limits for this parameter in step m2) until a solution is no longer produced.

4. The method according to claim 1 wherein in step f. between four and six coefficients $C_{n,m}$ are fixed.

5. The method according to claim 1 wherein in step f. the coefficients $C_{1,0}$ or $C_{1,1}$ are fixed.

6. The method according to claim 1 wherein in step i. less than 10 further coefficients $C_{n,m}$ are calculated.

7. The method according to claim 1 wherein in step a. the field distribution of the magnetic field $B_z$ is expanded in spherical harmonics.

8. The method according to claim 1 wherein in steps a. and b., respectively, the strength of the magnetic field $B_z$ radially outside the outermost cylinder or outside the respective outermost parallel plane is set to zero.

9. The method according to claim 1 wherein the electrically conductive sections of the magnet coils are arranged on two coaxial cylinders with the radii a and b, respectively.

10. The method according to claim 1 wherein in step d. a quantity which is proportional to the spatial oscillations of the current density j is selected as a further parameter.

11. The method according to claim 10 wherein the magnitude of the second derivative of the current density j with respect to the spatial coordinate in z-direction $$|d^2j/d_z^2|$$

is chosen as a further parameter.

12. The method according to claim 1 wherein in step d. a quantity which depends on the axial length l of the magnet coil configuration in z-direction is selected as a further parameter.

13. The method according to claim 12 wherein the integral of the magnitude of the current density j from the end of the magnet coil at l to $z = \infty$;

$$\int_l^\infty |j(z)| dz$$

is chosen as a further parameter.

14. The method according to claim 1 further comprising the step of making the electrically conductive sections from planar conductive metal foil.

15. The method according to claim 1 further comprising the step of making the electrically conducting sections separated along predetermined positions by grooves having a constant, and in comparison to the conductive sections, small width.

16. The method according to claim 14 or 15 wherein the step of making the electrically conductive sections includes making the sections from plate-like copper foil cut using a water jet technique.

17. The method according to claims 1 or 15 further comprising the step of making the electrically conductive sections from cylindrical copper tubes cut in a laser beam technique.

18. The method according to claim 17 further comprising the step of producing a number of magnet coils simultaneously from a single tube, said number being selected from the group of one and two.

19. The method according to claim 15 further comprising the step of impregnating the electrically conductive sections with resin after cutting the sections from a flat conductive material.

20. A magnet coil arrangement produced according to the method of claim 1.

21. The magnet coil arrangement according to claim 20 wherein the magnet coils are single-layered.

22. The magnet coil arrangement according to one of claims 20 and 21 further comprising gradient coil means for producing a magnetic gradient field.

23. The magnet coil arrangement according to claim 22 wherein the gradient coil means is shielded.

* * * * *